(12) United States Patent
Yamamoto et al.

(10) Patent No.: US 6,812,579 B2
(45) Date of Patent: Nov. 2, 2004

(54) SEMICONDUCTOR DEVICE

(75) Inventors: Toshio Yamamoto, Nagano (JP); Akio Izumi, Nagano (JP); Osamu Sugiyama, Nagano (JP)

(73) Assignee: Fuji Electric Co., Ltd., Kawasaki (JP)

(*) Notice: Subject to any disclaimer, the term of this patent is extended or adjusted under 35 U.S.C. 154(b) by 133 days.

(21) Appl. No.: 10/283,332

(22) Filed: Oct. 30, 2002

(65) Prior Publication Data

US 2003/0094675 A1 May 22, 2003

(30) Foreign Application Priority Data

Oct. 30, 2001 (JP) .......................................... 2001-332482

(51) Int. Cl.$^7$ .............................................. H01L 29/40
(52) U.S. Cl. ........................ 257/782; 257/666; 257/734; 257/783
(58) Field of Search ................................ 257/782–783, 257/785, 787, 727; 438/117, 125, FOR 372, FOR 370, FOR 382

(56) References Cited

U.S. PATENT DOCUMENTS 6,025,732 A * 2/2000 Foo et al. ..................... 324/760

FOREIGN PATENT DOCUMENTS

| JP | 402143466 | * 6/1990 | ........... H01L/31/02 |
| JP | 52-240710 | 9/1993 | |
| JP | 09-008358 | 1/1997 | |

* cited by examiner

*Primary Examiner*—Long Pham
*Assistant Examiner*—Nathan W. Ha

(57) ABSTRACT

A semiconductor device in which accuracy in mounting and positioning a semiconductor chip onto a package is improved without being affected by operation of a mounting unit such as a die bonder. The semiconductor device includes a semiconductor chip disposed on a die pad section of the package using guide projections and spring projections provided around the die pad section. The semiconductor chip is die bonded while being aligned with reference to the guide projections.

19 Claims, 12 Drawing Sheets

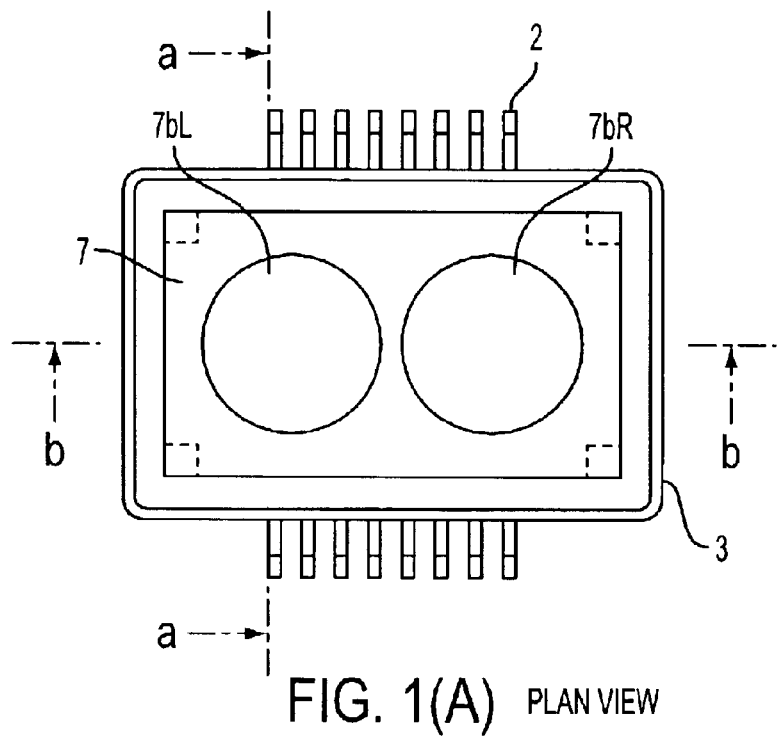
FIG. 1(A) PLAN VIEW
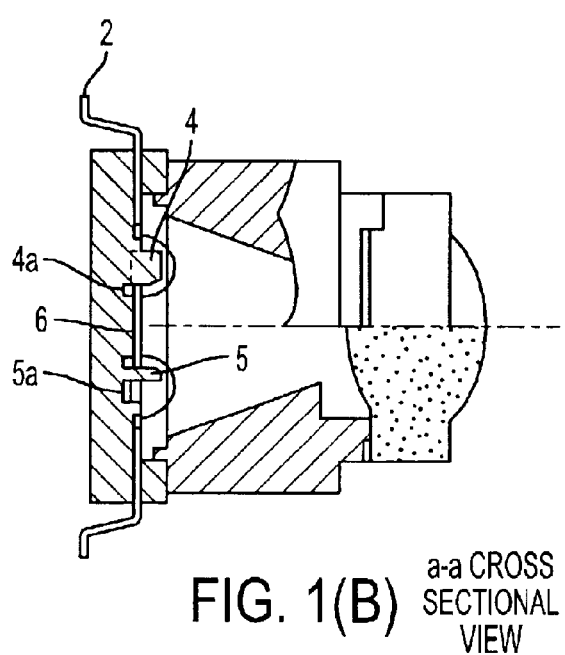
FIG. 1(B) a-a CROSS SECTIONAL VIEW

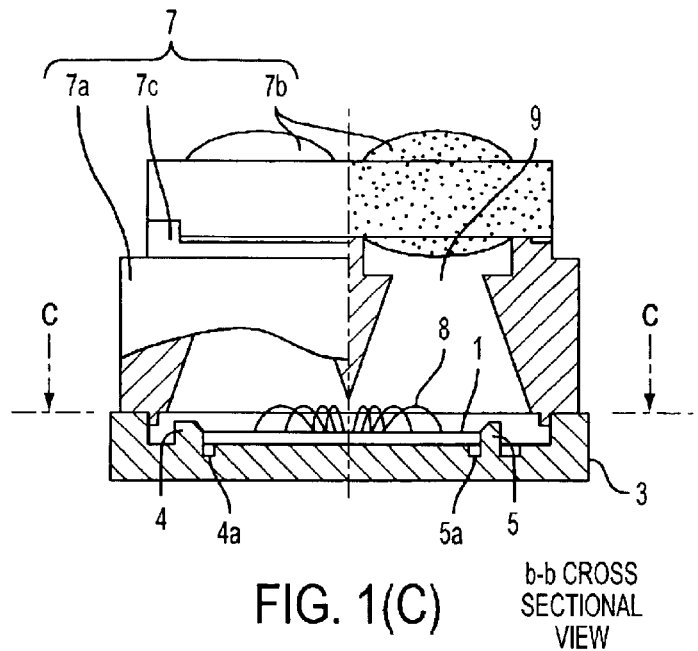
FIG. 1(C)  b-b CROSS SECTIONAL VIEW
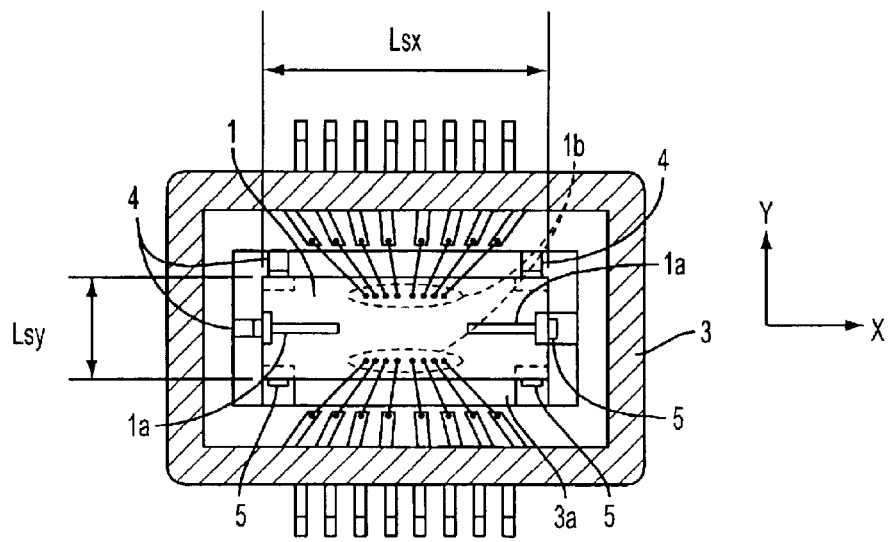
FIG. 1(D)  c-c CROSS SECTIONAL VIEW

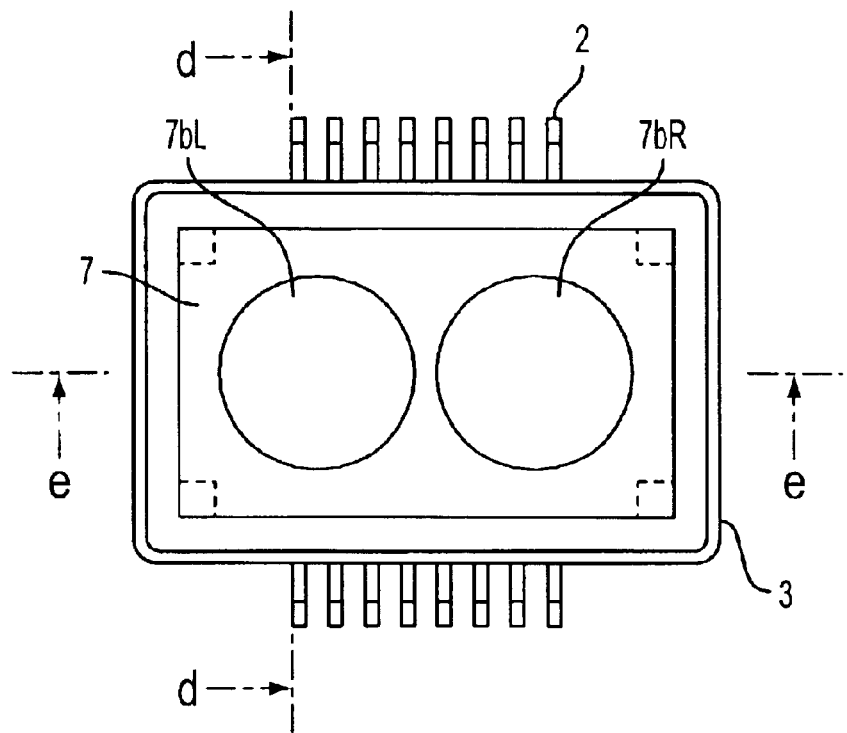
FIG. 4(A) PLAN VIEW
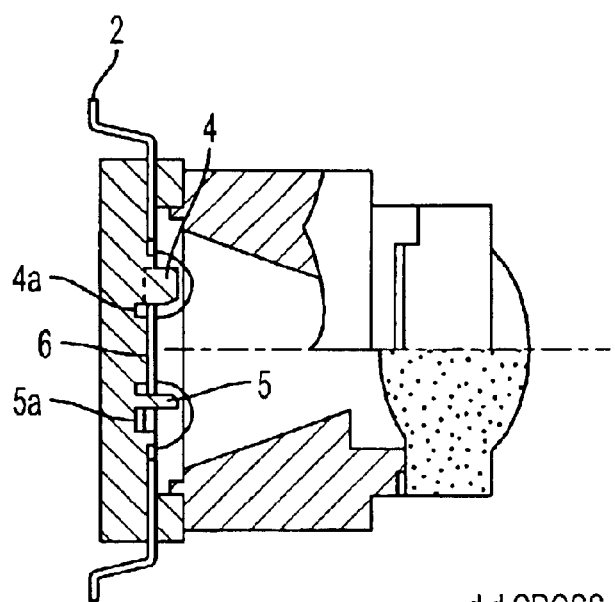
FIG. 4(B) d-d CROSS SECTIONAL VIEW

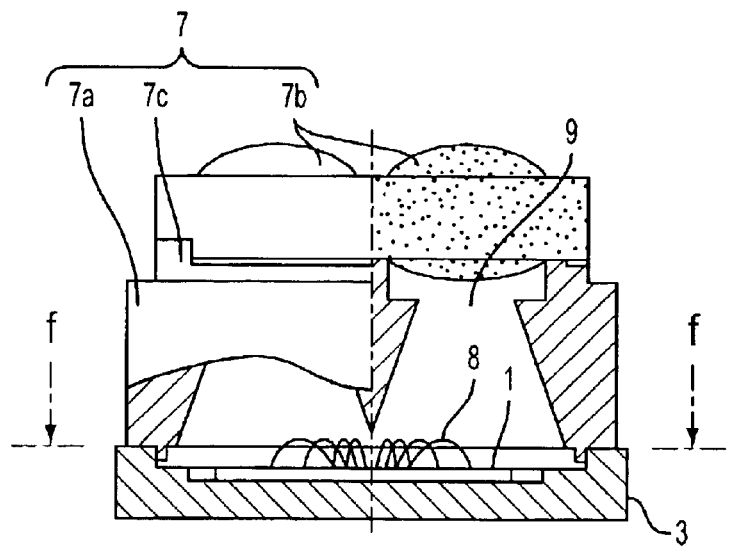
FIG. 4(C)  e-e CROSS SECTIONAL VIEW
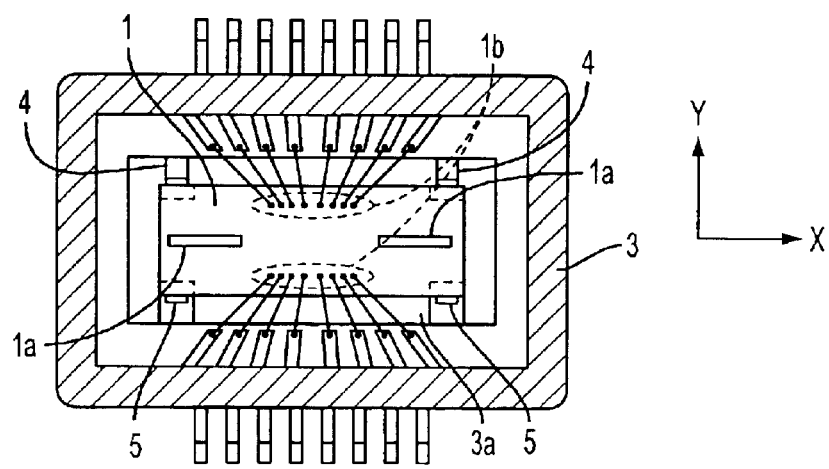
FIG. 4(D)  f-f CROSS SECTIONAL VIEW

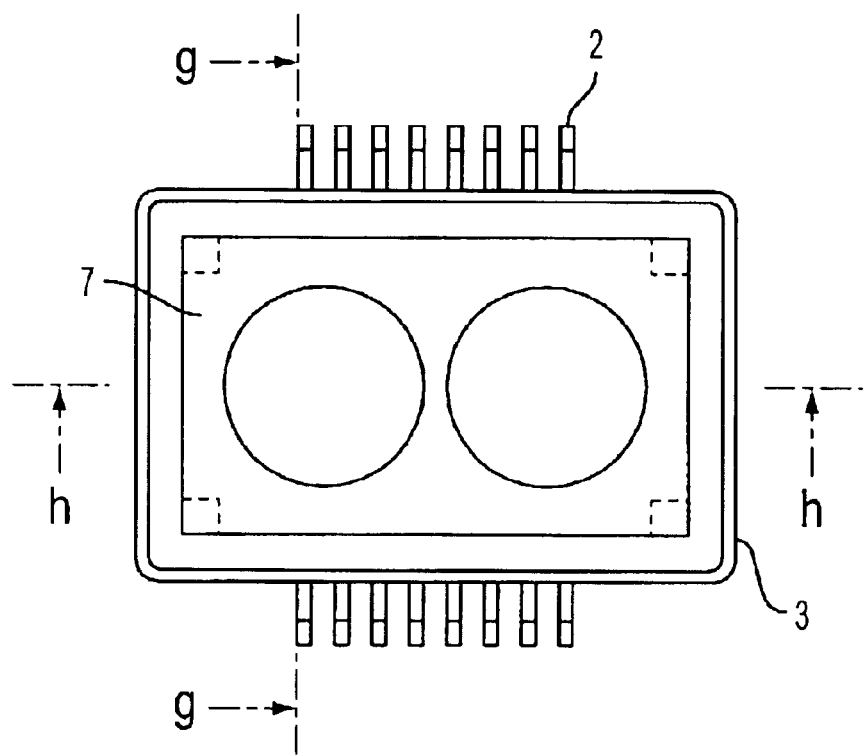
FIG. 5(A) PLAN VIEW
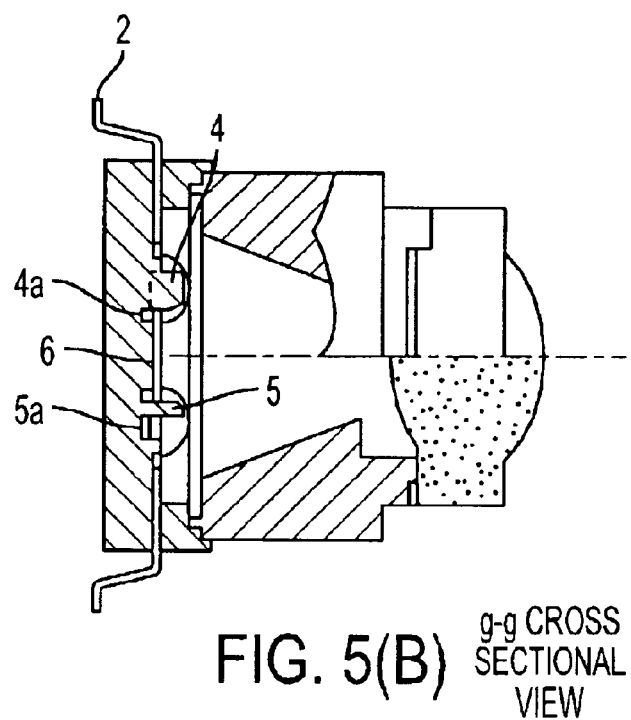
FIG. 5(B) g-g CROSS SECTIONAL VIEW

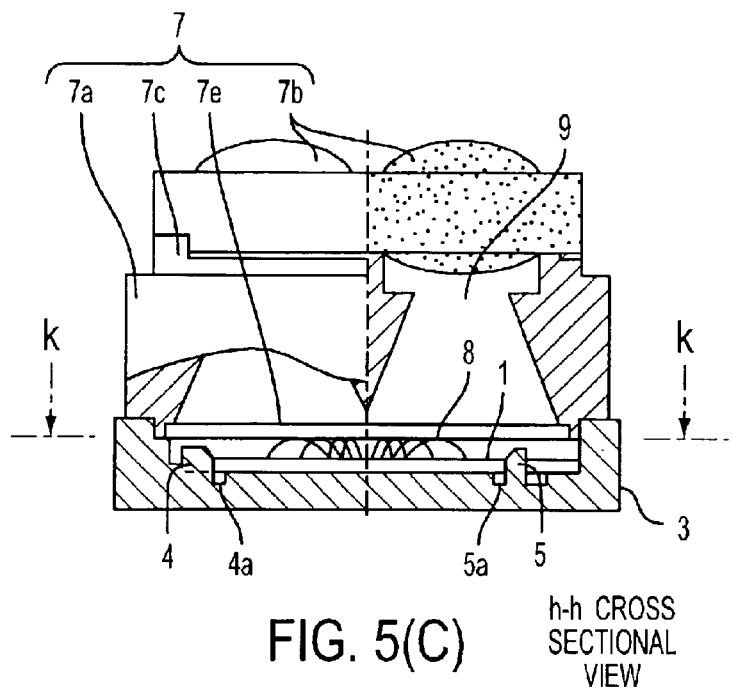
FIG. 5(C)  h-h CROSS SECTIONAL VIEW
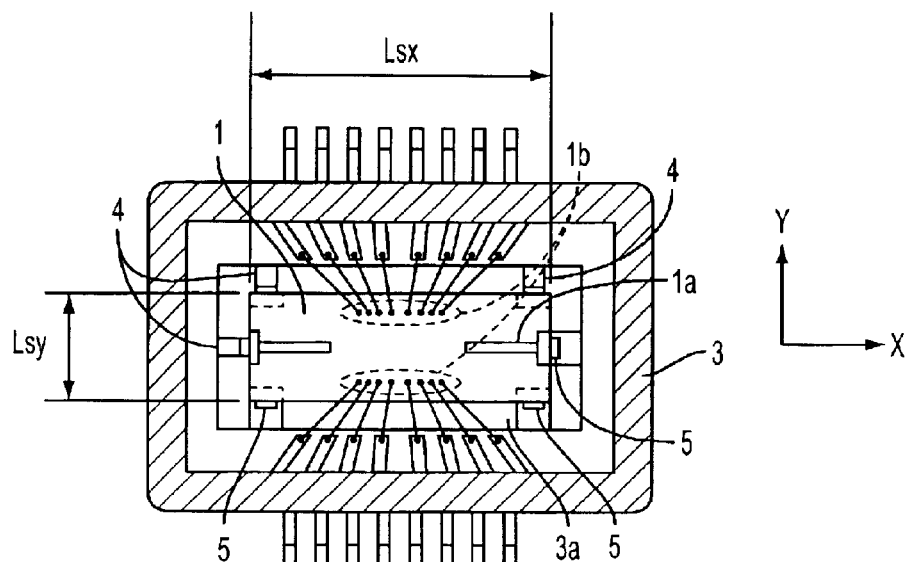
FIG. 5(D)  k-k CROSS SECTIONAL VIEW

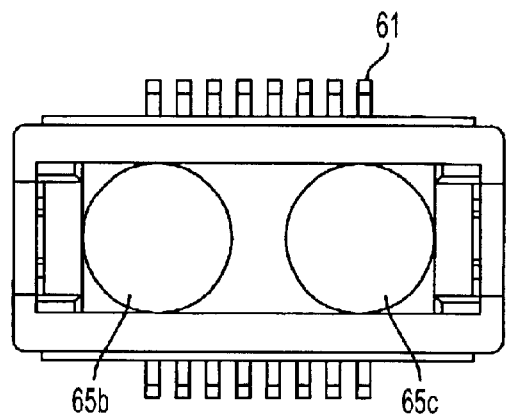
FIG. 7(A)
PRIOR ART
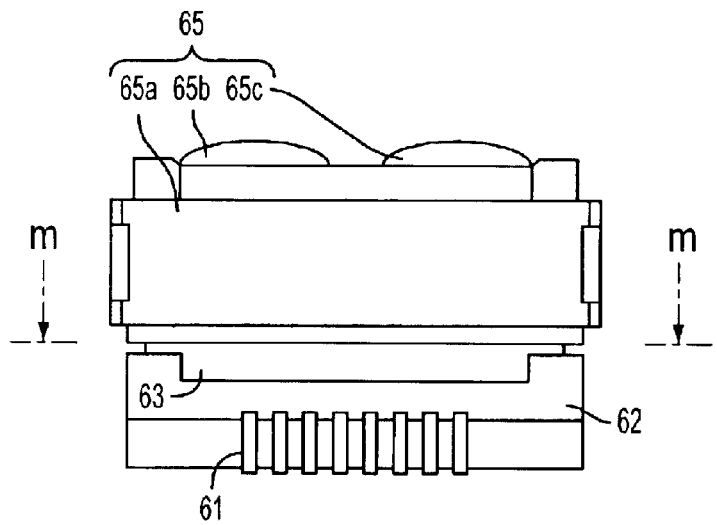
FIG. 7(B)
PRIOR ART
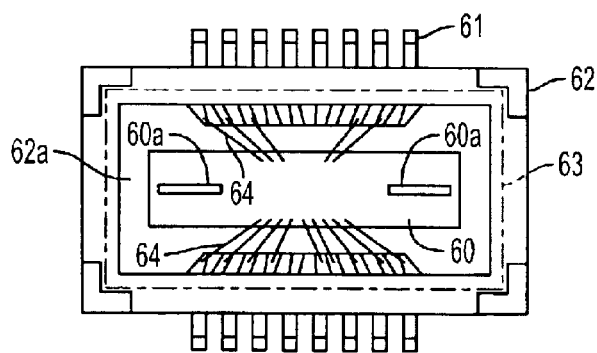
FIG. 7(C) m-m CROSS SECTIONAL VIEW
PRIOR ART

SEMICONDUCTOR DEVICE

CROSS-REFERENCE TO RELATED APPLICATION(S)

This application is based on, and claims priority to, JP PA 2001-332482 filed Oct. 30, 2001, the contents of which are incorporated by reference.

BACKGROUND OF THE INVENTION

1. Field of the Invention

The present invention relates to a semiconductor device in which, when a semiconductor chip is die bonded onto a package, alignment thereof is performed at the same time.

2. Description of the Related Art

As an example of a semiconductor device, a semiconductor photodetector element having a light detecting function will be explained. Examples of semiconductor photodetector elements include an image pick up CCD (charge coupled device), a line sensor (linear image sensor), a range finding module, etc.

Prior art relating to semiconductor photodetector elements will be explained with reference to the drawings.

An example of a semiconductor photodetector element is shown in FIGS. 6(A) through 6(C) and includes a semiconductor chip 50, leads 51, a package 52, an adhesive for die bonding 53, an optical element structure 54, wires 55, and a cavity 56.

On the surface of the semiconductor chip 50, there is provided a photodetector section 50a. The semiconductor chip 50 is die bonded to the package 52, which is integrally molded with the leads 51, on a die pad section 52a, using an adhesive for die bonding 53, such as epoxy resin. Electrodes 50b on the semiconductor chip 50 and the leads 51 are electrically connected by the wires 55 (for example, gold wires), respectively, and the optical element structure 54 is integrally formed on the package 52.

The optical element structure 54 is formed of transparent resin or inorganic glass with the whole or a part thereof having a parallel flat plate or a lens that is transparent to specific wavelengths of received light. The cavity 56 inside the package 52 is filled with a gas (for example, air) and/or a liquid (for example, silicone oil) that allows the transmission of the light with the specific wavelengths, thereby providing a light detecting function.

A second example of a semiconductor photodetector element, as shown in FIGS. 7(A) through 7(C), is an advanced type of the above-described semiconductor photodetector element.

The semiconductor photodetector element of FIGS. 7(A) through 7(C) includes a semiconductor chip 60 having photodetector sections 60a at two positions at the left and the right thereof, leads 61, a package 62 having a die pad section 62a, a first optical element structure 63 as a parallel flat plate, wires 64, and a second optical element structure 65 including a case 65a operating as both a case and an iris, a left-hand lens 65b, and a right-hand lens 65c. The first optical element structure 63 and the package 62 are bonded together by an adhesive. In addition, the second optical element structure 65 and the first optical element structure 63 are bonded together by an adhesive.

An example of a semiconductor light detecting device, which has been published in JP-A-5-240710, is shown in FIGS. 8(A) through 8(C). The semiconductor light detecting device is assembled with an image sensor chip 71 on a package 70 with package leads 72. The image sensor chip 71 and the package leads 72 are electrically connected by bonding wires 73. On the image sensor chip 71, there is formed a solder bump 74 at a specified position. A tunable optical band-pass filter 75 is positioned for mounting on the image sensor chip 71 by abutting the solder bump 74. The tunable optical bandpass filter 75 and the image sensor chip 71 are bonded together by an adhesive 76, on which a light shielding resin 77 is formed.

An example of a semiconductor light emitting element, which has been published in JP-A-9-8358, is shown in FIGS. 9(A) and 9(B). The semiconductor light emitting element of FIGS. 9(A) and 9(B) includes a semiconductor chip 80 that has become approximately cube-shaped as the area of semiconductor chip 80 has been downsized, thereby becoming tall and unstable. In particular, a lead 81 is provided with a recess 81a in which the bottom of the semiconductor chip 80 is placed. An electrode 80a is provided at the top and the bottom of the semiconductor chip 80, which has a light emitting layer. One electrode 80a is die bonded to the lead 81 at the bottom of the semiconductor chip 80, while the other electrode 80a is electrically connected to another lead 82 by a wire 83. Then, molding with a transparent resin is performed to form a semiconductor light emitting element. An advantage of the semiconductor light emitting element of FIGS. 9(A) and 9(B) is that the die bonding of the semiconductor chip 80 to the lead 81 can be easily performed.

In the semiconductor photodetector element having a light detecting function, as shown in FIGS. 6(A) through 6(C), the semiconductor chip 50 is mounted on the die pad section 52a of the package 52 using a die bonder (not shown). The mounting position of the semiconductor chip 50 to the package 52 depends largely on the performance of the die bonder.

For example, when the semiconductor chip 50 is picked up from a diced wafer by suction of a chuck of the die bonder for mounting on the package 52, there are variations in the position of the picked up semiconductor chip 50 with respect to the chuck or in the position of the chip when placed on the target package 52. Therefore, even when the chuck itself is aligned with high-accuracy, there is still a problem in that the position of the semiconductor chip 50 varies when placed on the package 52.

Moreover, in a die bonder with improved mounting accuracy, the position of the semiconductor chip 50 picked up by the chuck using suction is measured with respect to the position and the direction of the chuck using a measuring method such as image processing, and the position of the package 52 is measured before the semiconductor chip 50 is mounted on the package 52 to minimize misalignment error.

However, the semiconductor chip 50 moves when released from the chuck. Also, when the adhesive for die bonding 53 between the semiconductor chip 50 and the die pad section 52a is cured by heat or ultraviolet light, bonding the semiconductor chip 50 to the die pad section 52a, there arises a problem in that a shock applied during transfer to a curing processing unit, or nonuniform internal stress of the adhesive for die bonding 53 caused in a curing process, results in a shift in the position of the semiconductor chip 50. Similar problems exist in the semiconductor photodetector element shown in FIGS. 7(A) through 7(C) when mounting the semiconductor chip 60 on the package 62.

To cope with the shifting produced when the semiconductor chips 50 and 60 are die bonded, or when a lens (not shown) is combined with the optical element structure 54 in FIG. 6(C), an effective light detecting region of the semiconductor photodetector element is made larger within a margin in anticipation of the shift produced when assembling the semiconductor photodetector element. Thus, the produced shift between the center of the optical system and the center of the light detecting region can be corrected to attain the proper operation.

When the semiconductor photodetector element of FIGS. 7(A) through 7(C) is used, for example, as a range finding module, light beams providing scenes identical to each other are projected onto two linear photodetector sections 60*a* on the semiconductor chip 60 using the two convex lenses 65*b* and 65*c* of the second optical element structure 65, to obtain the distance to the scene using a phase difference between respective projected images. To prevent measuring error in the range finding, the second optical element structure 65 is mounted so that line segments connecting optical centers of the two convex lenses 65*b* and 65*c* to the centers of the respective photodetector sections 60*a* are parallel.

Thus, to eliminate the positional shift or alignment error of the semiconductor chip 60 using a separately provided optical measuring unit, the misalignment between centers of the convex lenses 65*b* and 65*c* and the respective photodetector sections 60*a* is measured. Then, the positions are adjusted to reduce alignment error. Thereafter, the second optical element structure 65 and the package 62 are integrally formed using adhesion. However, measurement of the misalignment between centers of the convex lenses 65*b* and 65*c* and respective photodetector sections 60*a* is not easy, and it is time consuming to perform the adjustment.

Thus, positioning is difficult in the semiconductor photodetector elements shown in FIGS. 6(A) through 7(C).

In addition, in FIGS. 8(A) through 8(C), to position the tunable optical band-pass filter 75 that abuts the solder bump 74, the tunable optical band-pass filter 75 must be integrally fixed by the adhesive 76 while remaining butted against the solder bump 74, which complicates production.

Further, in the semiconductor light emitting element shown in FIGS. 9(A) and 9(B), when the tall and unstable semiconductor chip 80 is fixed at the recess 81*a* of the lead 81, the semiconductor chip 80 is held in the recess 81*a* and die bonding is performed while the recess 81*a* is filled with a material having conductivity (for example, Ag epoxy). This necessitates the recess 81*a*, which is a square-shaped recess, being sufficiently larger than the semiconductor chip 80. Hence, the semiconductor chip 80 moves in a wide range within the recess 81*a*, making it difficult to improve the positioning accuracy of mounting the semiconductor chip 80.

SUMMARY OF THE INVENTION

It is an object of the present invention to provide a semiconductor device in which positional accuracy during mounting of the semiconductor chip onto the package is not affected by operation of a mounting unit such as a die bonder.

It is another object of the present invention to provide a semiconductor device having a structure in which the position of a semiconductor chip in a package can be easily aligned for die bonding and the position of the semiconductor chip can be maintained with high accuracy during the period in which the chip is being fixed to the package.

Another object of the present invention is to provide a semiconductor device having a light detecting function in which the position of a semiconductor chip in the package can be accurately determined, and the package and an optical element structure can be integrally formed easily with high accuracy by combining and bonding the package and the optical element structure while accurately positioning the optical element structure using a recessed and projected fitting structure.

Additional objects and advantages of the invention will be set forth in part in the description that follows, and, in part, will be obvious from the description, or may be learned by practice of the invention.

To achieve the above and other objects according to an embodiment of the present invention, there is provided a semiconductor device including a semiconductor chip die bonded on a die pad section of a package, guide projections around a perimeter of the die pad section of the package, and spring projections around the perimeter of the die pad section of the package. Each spring projection is arranged opposite an associated guide projection. The semiconductor chip is pushed against the guide projections by the spring projections to align the semiconductor chip for die bonding on the die pad section. Each of the guide projections is used as a reference for alignment.

The semiconductor chip is disposed on the die pad section by a die bonder and held between the spring projections and the guide projections. The semiconductor chip is pushed against the guide projections by the spring projections for alignment with reference to the guide projections. Therefore, the alignment is unaffected by the positioning accuracy of the die bonder or a package transporting unit, which makes it possible to improve alignment accuracy just by improving positional accuracy of the package or the guide projections.

According to another aspect of the present invention, the guide projections and the spring projections are provided in pairs and a pushing direction of one of the spring projections toward the associated guide projection in a pair crosses another pushing direction in another pair. In this aspect of the present invention, the pushing forces of the guide projections and the spring projections are provided in a lateral direction and a longitudinal direction, and cross approximately perpendicularly to each other. Thus, the semiconductor chip can be fixed to the guide projections and positioned to reduce movement in two directions.

According to another aspect of the present invention, the guide projections and the spring projections are provided in pairs in which each pushing direction of the spring projections toward the associated guide projections is in the same direction. In this aspect of the present invention, the guide projections and the spring projections provide a pushing force in only the lateral direction or the longitudinal direction. Thus, although the semiconductor chip is fixed to the guide projections to restrict movement in the pushing direction, movement of the semiconductor chip is not restricted in the direction approximately perpendicular to the pushing direction. This is effective when strict positioning accuracy is not required in the movable direction, allowing positioning accuracy of the die bonder. In addition, the pushing force provided by the guide projections and the spring projections is sufficiently strong that movement of the semiconductor chip in the movable direction is not easy, making it possible to sufficiently fix the position of the semiconductor chip, even when the adhesive for die bonding is being cured.

According to another aspect of the present invention, the package has a recess with a bottom that is lower than the die pad section between the spring projections and the guide projections at least at a front of the guide projections. When the guide projections vertically project directly from the same face as that of the die pad section of the package, a somewhat lifted fillet produced during resin molding, or particles or debris, may be present at a square corner formed between the package and the guide projections, if the recess is not provided. The fillet or particles between the semiconductor chip and the package may cause misalignment of the semiconductor chip on the package. However, with the recess provided, the fillet is formed in the recess, preventing the semiconductor chip from abutting the fillet. Moreover, the particles drop into the recess, preventing the semiconductor chip from abutting the particles. Thus, it becomes possible to maintain accurate alignment.

According to another aspect of the present invention, the package has a recess with a bottom that is lower than the die pad section, the recess surrounding a bottom of the spring projections. When the spring projections vertically project directly from the same face as that of the die pad section of the package without the recess being provided, the semiconductor chip, the height of which is determined by the die pad section of the package, butts against the spring projections at a square corner of a root thereof. This occurs at a portion of the spring projection having a limited amount of bending, making it difficult to fit a large semiconductor chip into the die pad section, which may cause misalignment of the semiconductor chip. However, with the recess provided, the spring projections bend sufficiently at a portion against which the semiconductor chip abuts. Also, the recess may surround each spring projection to further facilitate bending. Thus, even a large semiconductor chip may be fitted onto the die pad section. In addition, as described above, particles or debris drop into the recess so that the semiconductor chip does not abut the particles. Thus, it becomes possible to maintain accurate alignment.

According to another aspect of the present invention, each of the spring projections and the guide projections has a guiding sloped portion on a side facing the die pad section to guide the semiconductor chip. Even though the semiconductor chip may be misaligned as it is being vertically placed on the die pad section by the die bonder, the semiconductor chip is guided between the spring projections and the guide projections by the guiding sloped portion. Therefore, the semiconductor chip can be accurately fitted into the die pad section.

According to another aspect of the present invention, an optical element structure is mounted on the package and has an optical system that positions a focal point at the semiconductor chip. A recessed and projected fitting structure is provided to align the optical element structure onto the package. The recessed and projected structure includes a fitting recess provided in the package and a fitting projection provided in the optical element structure. The fitting recess and the fitting projection are fitted together to align the optical element structure onto the package.

In this aspect of the present invention, the optical element structure is positioned and mounted on the semiconductor chip, which has been accurately positioned on the package, by the recessed and projected fitting structure. For example, an optical axis of a photodetector section of the semiconductor chip having a light detecting function and an optical axis of the optical element structure (for example, a convex lens) are made to coincide with each other. This offers an advantage in that alignment adjustments are completed at the same time the mounting is completed. The package and the optical element structure may include the fitting recess and the fitting projection, respectively, or the package and the optical element structure may include the fitting projection and the fitting recess, respectively, as required.

According to another aspect of the present invention, in a direction in which strict alignment of the optical element structure is required, an adjustment clearance area in the recessed and projected fitting structure is enlarged, and in a direction in which no alignment of the optical element structure is required, the adjustment clearance area is reduced. In this aspect of the present invention, if a semiconductor device requires more precise alignment in one direction, the adjusting range of the optical element structure is increased in the direction in which more precise alignment is required. In the direction in which no alignment or less precision is required, the adjusting range is narrowed. This enables an adjustment to be carried out when adjustments are limited to one direction.

According to another aspect of the present invention, the package and the optical element structure are fixed to each other using an adhesive. After adjustments are completed, the package and the optical element structure are integrally fixed by bonding to maintain the alignment.

According to another aspect of the present invention, a method of aligning a semiconductor chip on a die pad of a semiconductor device is provided including forming guide projections around a perimeter of the die pad; forming spring projections around the perimeter of the die pad, each spring projection being paired with an associated guide projection; placing the semiconductor chip on the die pad between the guide projections and the spring projections, the spring projections bending to receive the semiconductor chip and pushing the semiconductor chip against the guide projections to align the semiconductor chip; and die bonding the aligned semiconductor chip to the die pad.

These, together with other aspects and advantages that will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

These and other aspects and advantages of the present invention will become apparent and more readily appreciated from the following description of the embodiments, taken in conjunction with the accompanying drawings, of which:

FIG. 1(A) is a plan view of a semiconductor device according to an embodiment of the present invention in which a semiconductor chip and an optical element structure are die bonded together;

FIG. 1(B) is a cross-sectional view of the semiconductor device of FIG. 1(A) taken along the line a—a;

FIG. 1(C) is a cross-sectional view of the semiconductor device of FIG. 1(A) taken along the line b—b;

FIG. 1(D) is a cross-sectional view of the semiconductor device of FIG. 1(C) taken along the line c—c;

FIG. 4(A) is a plan view of a semiconductor device according to another aspect of the present invention, in which a semiconductor chip and an optical element structure are die bonded together;

FIG. 4(B) is a cross-sectional view of the semiconductor device of FIG. 4(A) taken along the line d—d;

FIG. 4(C) is a cross-sectional view of the semiconductor device of FIG. 4(A) taken along the line e—e;

FIG. 4(D) is a cross-sectional view of the semiconductor device of FIG. 4(C) taken along the line f—f;

FIG. 5(A) is a plan view of a semiconductor device according to another aspect of the present invention in which a semiconductor chip and an optical element structure are die bonded together;

FIG. 5(B) is a cross-sectional view of the semiconductor device of FIG. 5(A) taken along the line g—g;

FIG. 5(C) is a cross-sectional view of the semiconductor device of FIG. 5(A) taken along the line h—h;

FIG. 5(D) is a cross-sectional view of the semiconductor device of FIG. 5(C) taken along the line k—k;

FIGS. 7(A) through 7(C) are explanatory views of another conventional semiconductor photodetector element;

DETAILED DESCRIPTION OF THE PREFERRED EMBODIMENTS

Figure 2:
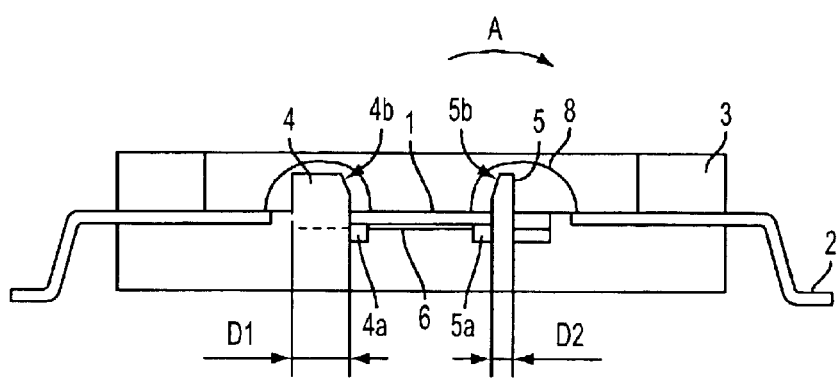
FIG. 2 is a partially enlarged view of the semiconductor device shown in FIG. 1(B)

FIGS. 1(A) through 1(D) are structural views of a semiconductor device according to an embodiment of the present invention. FIG. 1(A) is a plan view of a semiconductor device in which a semiconductor chip and an optical element structure are die bonded together. FIG. 1(B) is a cross-sectional view of the semiconductor device of FIG. 1(A) taken along the line a—a. FIG. 1(C) is a cross-sectional view of the semiconductor device of FIG. 1(A) taken along the line b—b. FIG. 1(D) is a cross-sectional view of the semiconductor device of FIG. 1(C) taken along the line c—c. FIG. 2 is a partially enlarged view of the semiconductor device shown in FIG. 1(C). FIG. 3 is an explanatory view of a recessed and projected fitting structure provided at jointing faces of a package and an optical element structure. The semiconductor device according to the embodiment of the present invention detects light (hereinafter referred to as a semiconductor photodetector device).

The semiconductor photodetector device shown in FIGS. 1(A) through 1(D) includes a semiconductor chip 1, leads 2, a package 3, guide projections 4, spring projections 5, an adhesive for die bonding 6, an optical element structure 7, wires 8, and a cavity 9.

The semiconductor chip 1, as shown in FIG. 1(D), has a pair of photodetector sections 1a and a plurality of electrodes 1b. In addition, on the semiconductor chip 1, there are formed circuits (not shown) such as amplifiers for signal processing, memories, address decoders, etc.

The leads 2 are made of an alloy with iron or copper as a base material.

The package 3 is integrally molded with the leads 2 by injection molding using a light shielding resin. A central portion of the package 3 is a die pad section 3a, onto which the semiconductor chip 1 is disposed, as shown in FIG. 1(D).

Each of the guide projections 4 and the spring projections 5 is integrally molded, as a part of the package 3, around the die pad section 3a. Each of the guide projections 4 is paired with a spring projection 5 and arranged opposite each other with the semiconductor chip 1 held therebetween. The guide projections 4 and the spring projections 5 are provided in two pairs on long sides of the semiconductor chip 1 and in one pair on short sides thereof so that the semiconductor chip 1 is aligned both in the X and Y directions.

FIG. 2 shows the semiconductor chip 1 held between one of the guide projections 4 and an associated spring projection 5. The position of the guide projection 4 is used as a reference position for alignment of the semiconductor chip 1. The guide projection 4 has a thickness D1 that is larger than the thickness of the spring projection 5 to provide sufficient rigidity to withstand a fitting force applied during die bonding. The spring projection 5 has a thickness D2 that is less than the thickness D1 of the guide projection 4 to provide sufficient flexibility to be easily deformed in the direction indicated by an arrow A in FIG. 2 by the fitting force exerted by the semiconductor chip 1.

The guide projection 4 and the spring projection 5 have guiding sloped portions 4b and 5b, respectively, on upper portions of the sides thereof accommodating the semiconductor chip 1, so that the semiconductor chip 1 is easily and smoothly fitted within the guide and spring projections 4 and 5 during die bonding.

As shown in FIG. 1(D), Lsx and Lsy are distances between respective inner faces of a guide projection 4 and a spring projection 5, between which the semiconductor chip 1 is fitted. Lsx and Lsy are less than (10 to 30 $\mu$m) the length and the width of the external shape of the semiconductor chip 1. Thus, when the semiconductor chip 1 is die bonded on the die pad section 3a, the spring projection 5 accepts the semiconductor chip 1 while being slightly deformed and bent, pushing the semiconductor 1 toward a reference face of the guide projection 4.

The material of the semiconductor chip 1 differs from that of the guide projection 4 and the spring projection 5 in that the material of the semiconductor chip 1 is hard and that of the guide projection 4 and the spring projection 5 is soft. Hence, when the semiconductor chip 1 is fitted between the guide projection 4 and the spring projection 5, each of the side faces of the semiconductor chip 1 slightly bites into respective side faces of the guide projection 4 and the spring projection 5, and such a state is maintained. Therefore, unlike conventional semiconductor devices, on the side face of the guide projection 4 that contacts the semiconductor chip 1, or on the side face of the spring projection 5 that contacts the semiconductor chip 1, there is no need to additionally provide a projection that projects over the upper face of the semiconductor chip 1 to prevent the semiconductor chip 1 from lifting up and separating from the die pad section 3a. This makes the structure of the semiconductor device less complex.

Moreover, at a root of the side face of the guide projection 4 contacting the semiconductor chip 1 and at a root of the side face of the spring projection 5 contacting the semiconductor chip 1, a recess 4a and a recess 5a are provided, respectively (see FIGS. 1(B) and 1(C), and FIG. 2). When the guide projection 4 and the spring projection 5 contact the semiconductor chip 1, causing slight cuts or cracks in the materials thereof during die bonding of the semiconductor 1, the resulting broken pieces are received inside the recesses 4a and 5a. Thus, no broken pieces fall between the bottom of the semiconductor chip 1 and the surface of the die pad section 3a that would cause the semiconductor chip 1 to be raised from the die pad section 3a.

For example, if the guide projection 4 projects vertically from the package 3 without the recess 4a being provided at the root of the guide projection 4, at a square corner formed between the package 3 and the guide projection 4, a somewhat lifted portion (fillet) of resin that is produced during molding of the package 3 and any broken pieces cause misalignment of the semiconductor chip 1 with respect to the package 3. However, by using the arrangement as described above with the recess, the semiconductor chip 1 does not contact the fillet or broken pieces, enabling accurate alignment.

Further, assume the recess 5*a* is not provided at the root of the spring projection 5, which vertically projects from the package 3. The height of the semiconductor chip 1 is determined by the die pad section 3*a* of the package 3. The semiconductor chip 1 butts against the spring projection 5 at the square corner of the root thereof, that is, at a portion with little flexibility, which may prevent the semiconductor chip 1 having a large external shape from being fitted onto the die pad section 3*a*. However, by providing the recess 5*a* as described above, the spring projection 5 bends sufficiently at a portion contacting the semiconductor chip 1. Thus, even though the semiconductor chip 1 may be large, the semiconductor chip 1 may still fit onto the die pad section 3*a*.

The shape of the recess 4*a* at the root of the guide projection 4 and the recess 5*a* at the root of the spring projection 5 are not limited to the shapes shown in FIG. 2, for example. Various other shapes may be used that provide the same operability.

The adhesive 6 for die bonding is a material such as epoxy resin, which is applied to the die pad section 3*a* beforehand when performing die bonding.

The optical element structure 7 (FIG. 1(C)) includes a case 7*a* operating as both a case and an iris, lenses 7*b*, and a projected and recessed fitting structure 7*c*. The case 7*a* is made, for example, of a light shielding resin. The lenses 7*b* are convex lenses made of a transparent resin. The case 7*a* and the lenses 7*b* are molded by injection molding.

The case 7*a* and the lenses 7*b* are combined using the projected and recessed fitting structure 7*c* with the smallest possible clearance therebetween (between jointed sections) or with a slight elastic deformation, to satisfy optical precision, and then integrally formed by bonding.

The wires 8 electrically connect the electrodes 1*b* of the semiconductor chip 1 and the leads 2, respectively. The wires 8 are, for example, gold wires or aluminum wires.

The manufacturing process of the semiconductor photodetector element is described below. During manufacturing, the semiconductor chip 1 is die bonded while being held between the guide projections 4 and the spring projections 5 provided around the die pad section 3*a* of the package 3. The semiconductor chip 1 is die bonded onto the die pad section 3*a* of the package 3 and fixed by curing the adhesive 6 for die bonding.

To the die pad section 3*a*, the adhesive 6 for die bonding is applied beforehand. On the die pad section 3*a* of the package 3, the semiconductor chip 1 is mounted by a die bonder (not shown) and pressed so as to be inserted between the guide projections 4 and the spring projections 5. The spring projections 5 bend and are slightly deformed to accept the semiconductor chip 1 and press the semiconductor chip 1 onto the reference face (the face contacting the semiconductor chip 1) of the guide projections 4.

The semiconductor chip 1, while being guided by the guide projections 4 and the spring projections 5 as described above for accurate positioning, is held between the guide projections 4 and the spring projections 5 so that the semiconductor chip 1 may be fixed into the package 3.

Subsequently, the adhesive 6 for die bonding is cured. The method of curing differs depending on the type of adhesive used for die bonding. In general, for a thermosetting type of adhesive, the adhesive is left for a given amount of time in a high temperature environment. For an ultraviolet curing type of adhesive, the adhesive is irradiated by ultraviolet light until the integrated amount of irradiation becomes a specified value.

The semiconductor chip 1 is held between the guide projections 4 and the spring projections 5 to maintain the position thereof with respect to the package 3. Therefore, the position of the semiconductor chip 1 can be accurately maintained, even while being transported or cured.

Following curing, the case 7*a* and the lenses 7*b* of the optical element structure 7 are assembled. The case 7*a* and the lenses 7*b* are combined using the projected and recessed fitting structure 7*c* with the smallest possible clearance therebetween (between jointed sections) or with a slight elastic deformation, to satisfy optical precision, and then integrally formed by bonding. Then, the optical element structure 7 is assembled onto the package 3.

The case 7*a* of the optical element structure 7 and the package 3 are assembled using a fitting recess 3*b* and a fitting projection 7*d* of a recessed and projected fitting structure 10 (see FIGS. 3(A) through 3(D)). Similar to combining the case 7*a* and the lenses 7*b* using the recessed and projected fitting structure 7*c*, the optical element structure 7 and the package 3 are combined using the recessed and projected fitting structure 10 with the smallest possible clearance therebetween or with a slight elastic deformation to satisfy optical precision. The aligned optical element structure 7 and the package 3 are then integrally formed by bonding to complete the semiconductor photodetector element.

It is not necessary for the guide projections 4 and the spring projections 5 to be molded integrally with the package 3. For example, each guide projection 4 can be a stepped face, a potted resin, or a solder bump. Also, the spring projection 5, which pushes the semiconductor chip 1 against the guide projection 4 in the direction of the guide projection 4, may be, for example, a stepped face, a metal plate, or potted resin having elasticity. However, to simplify the process and accuracy of alignment, the guide projections 4 and the spring projections are molded integrally with the package 3.

Furthermore, while the guide projections 4 and the spring projections 5 have been shown as two pairs in the Y direction and one pair in the X direction, other arrangements of pairs may be selected.

According to the embodiment of the present invention, the semiconductor chip 1 and the package 3, and the optical element structure 7 and the package 3 are respectively combined and aligned accurately. Therefore, a semiconductor photodetector element can be conveniently and accurately manufactured.

Another aspect of the present invention is shown in FIGS. 4(A) through 4(D). FIG. 4(A) is a plan view of a semiconductor device in which a semiconductor chip and an optical element structure are die bonded together. FIG. 4(B) is a cross-sectional view of the semiconductor device of FIG. 4(A) taken along the line d—d. FIG. 4(C) is a cross-sectional view of the semiconductor device of FIG. 4(A) taken along the line e—e. FIG. 4(D) is a cross-sectional view of the semiconductor device of FIG. 4(C) taken along the line f—f. The same reference numerals are respectively attached to common members and, thus, detailed explanations thereof are omitted.

In the aspect of the invention shown in FIG. 1(D), the guide projections 4 and the spring projections 5 are provided in both the X direction and the Y direction of the semiconductor chip 1 so that the semiconductor chip 1 is aligned in the X and Y directions during die bonding. However, accuracy is sometimes required for alignment in only one direction with accuracy for alignment in the other direction being sufficient, even considering the mounting accuracy of the die bonder. Therefore, in contrast to the embodiment of the invention shown in FIG. 1(D), in which a plurality of pairs of the guide projections 4 and the spring projections 5 are provided to restrict movement both in the X direction and in the Y direction, in the embodiment shown in FIGS. 4(A) through 4(D), a pair of the guide projections 4 and the spring projections 5 restricting movement in the X direction is removed. Thus, no movement restrictions are provided in the X direction.

As shown in FIGS. 4(A) through 4(D), two pairs of the guide projections 4 and the spring projections 5 are provided in only one direction, for example, in the Y direction, to restrict only the position in the Y direction and the attitude.

However, even when moving in the X direction, the semiconductor chip 1 is held tightly between the guide projections 4 and the spring projections 5 while being pushed in the Y direction. Thus, to move the semiconductor chip 1 in the X direction, a sufficient force of a certain magnitude or more must be applied. Thus, the semiconductor chip 1 does not move easily in the X direction. Therefore, the semiconductor chip 1 is fixed onto the die pad section 3a with high positioning accuracy in the Y direction by the guide projections 4 and with positioning accuracy of the die bonder in the X direction. The semiconductor chip 1 is also fixed during curing processing, which is subsequently performed, thereby achieving alignment with high accuracy.

The number of pairs and the setting direction of the guide projections 4 and the spring projections 5 are not limited, but can be freely set in accordance with requirements for alignment depending on the characteristics of the particular semiconductor photodetector element being manufactured.

In the embodiment of the invention shown in FIGS. 3(A) through 3(D), the recessed and projected fitting structure 10, which includes the fitting recess 3b of the package 3 and the fitting projection 7d of the optical element structure 7, is provided for alignment during fitting. However, in some cases, alignment is required with a more precise positioning accuracy. For example, the required positioning accuracy may be less than 10 µm.

When stricter positioning accuracy is required, in the recessed and projected fitting structure 10 at the jointed section of the package 3 and the optical element structure 7, either the X direction or the Y direction is used as the direction of alignment for fitting. The other direction is used as the movable direction. In the aspect of the present invention shown in FIG. 3(C), the Y direction is taken as the direction of alignment for fitting, and the X direction is taken as the movable direction, as shown in FIG. 3(D).

Figure 3A:
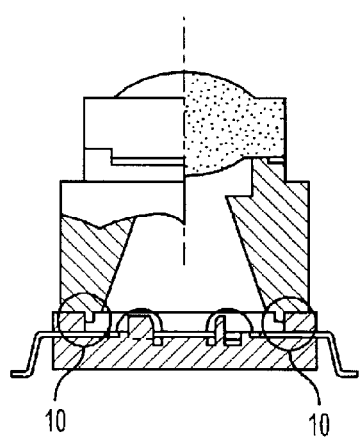
FIGS. 3(A) through 3(D) are explanatory views of a recessed and projected fitting structure provided on jointing faces of a package and an optical element structure.
Figure 3B:
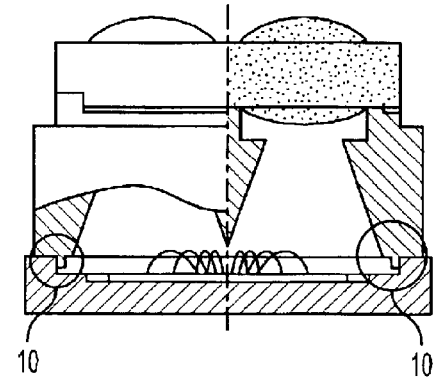
Figure 3C:
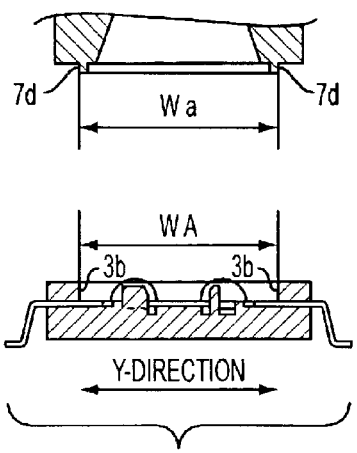

In the direction of alignment for fitting, as shown in FIG. 3(C), a width WA of the fitting recess 3b of the package 3 and a width WA of the fitting projection 7d of the optical element structure 7 are made approximately equal to each other. Then, the fitting projection 7d of the optical element structure 7 is fitted to the fitting recess 3b of the package 3. Thus, there being little clearance between the fitting recess 3b and the fitting projection 7d, immediate positioning may be achieved.

Figure 3D:
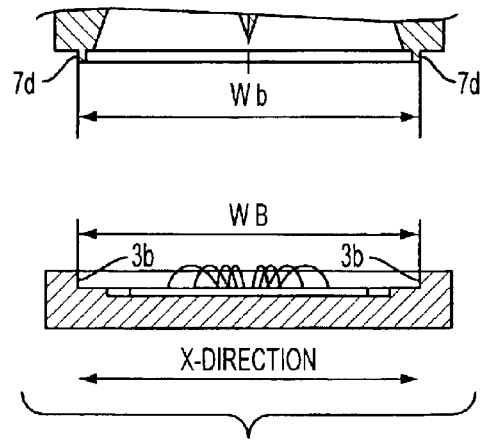
Figure 6A:
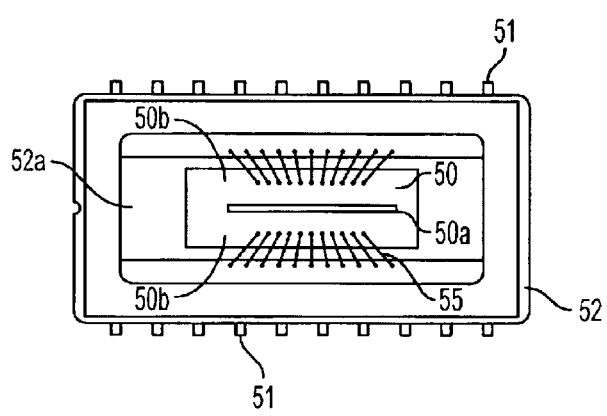
FIGS. 6(A) through 6(C) are explanatory views of a conventional semiconductor photodetector element.
Figure 6B:
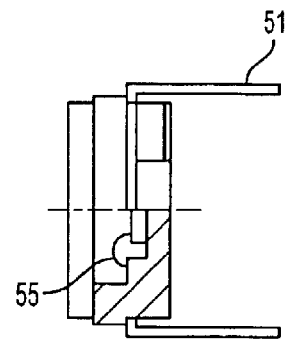
Figure 6C:
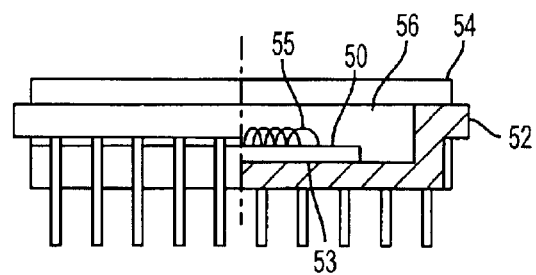
Figure 8A:
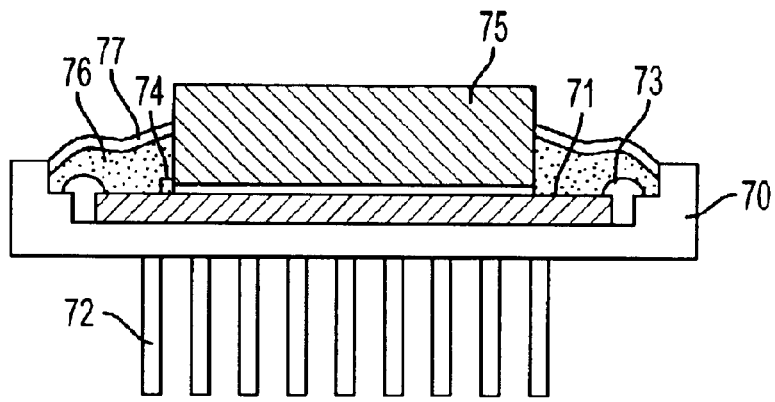
FIGS. 8(A) through 8(C) are explanatory diagrams of a conventional semiconductor light detecting device.
Figure 8B:
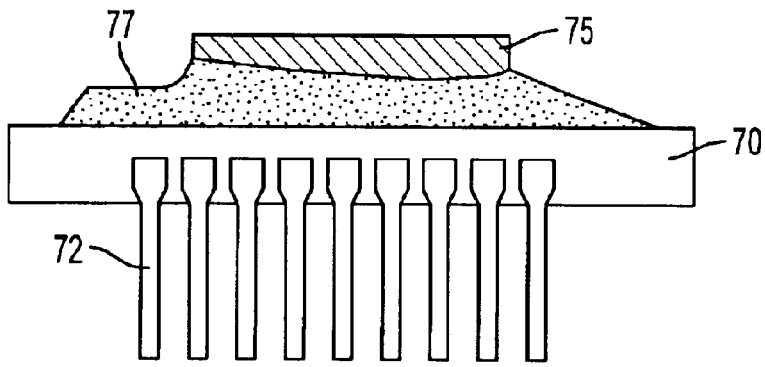
Figure 8C:
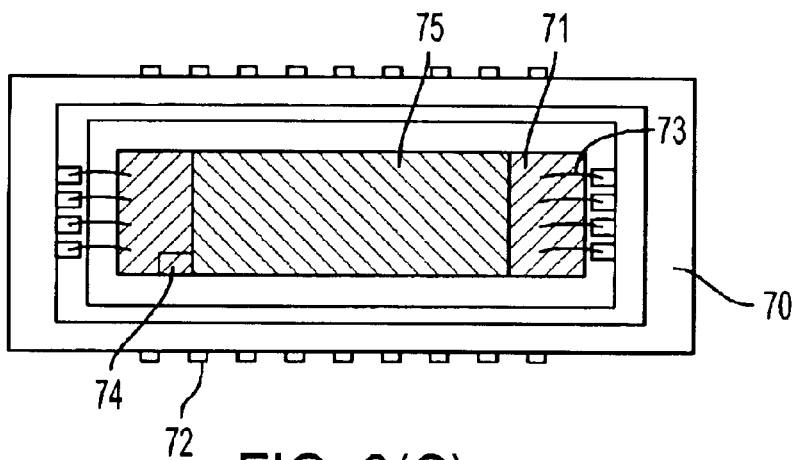
Figure 9A:
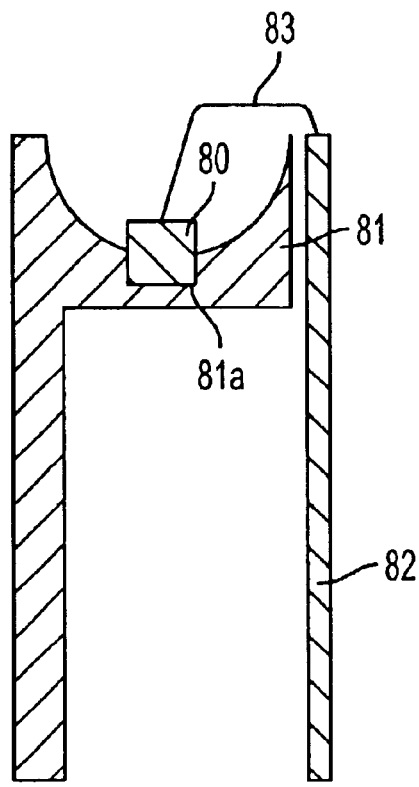
FIGS. 9(A) and 9(B) are explanatory views of a conventional semiconductor light emitting element.
Figure 9B:
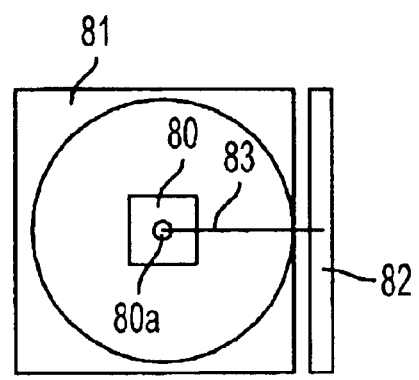

In the movable direction, as shown in FIG. 3(D), a width Wb of the fitting projection 7d of the optical element structure 7 is made smaller than a width WB of the fitting recess 3b of the package 3. Thus, even though the fitting projection 7d of the optical element structure 7 is combined with the fitting recess 3b of the package 3, there still remains a clearance or slack, allowing movement within a slight distance. The clearance is determined by summing an adjusting margin and variation in parts accuracies (for example, of the order of 100 µm). In this way, even when strict alignment is required in the X direction, positioning adjustments may be made so that satisfactory optical performance can be achieved.

A way of measuring in the direction in which alignment with higher accuracy is required is shown using, for example, FIGS. 1(A) through 1(D). Alignment marks and the patterns of the photodetector sections 1a are observed as pictures through a left-hand lens 7bL and a right-hand lens 7bR of the optical element structure 7. From the deviation between the respective pictures obtained from the left lens 7bL and the right 7bR, a relative amount of deviation between the optical element structure 7 and the semiconductor chip 1 is detected, which is used for alignment. Other types of ways to measure relative positional relationships among the semiconductor chip 1, the package 3, and the optical element structure 7 may be used.

Although the fitting recess 3b has been shown in FIGS. 3(C) and 3(D) as being formed on the package 3 and the fitting projection 7d as being formed on the optical element structure 7, the fitting projection 7d may be formed on the package 3 and the fitting recess 3b may be formed on the optical element structure 7.

As described above, by adjusting the combining clearance in the recessed and projected fitting structure 10 when combining the package 3 and the optical element structure 7, as shown in FIGS. 3(A) through 3(D), accurate alignment may be achieved in the movable direction of the semiconductor chip 1.

Furthermore, combining the package 3 and the optical element structure 7 using the recessed and projected fitting structure 10 and adjusting the combining clearance in the recessed and projected fitting structure 10 allows more precise alignment initially so that any subsequent alignment is minimal.

FIGS. 5(A) through 5(D) illustrate structural views of a semiconductor device according to another aspect of the present invention. FIG. 5(A) is a plan view of a semiconductor device in which a semiconductor chip and an optical element structure are die bonded together. FIG. 5(B) is a cross-sectional view of the semiconductor device of FIG. 5(A) taken along the line g—g. FIG. 5(C) is a cross-sectional view of the semiconductor device of FIG. 5(A) taken along the line h—h. FIG. 5(D) is a cross-sectional view of the semiconductor device of FIG. 5(C) taken along the line k—k. The same reference numerals are respectively attached to common members and, thus, detailed explanations thereof are omitted.

In addition to the case 7a, the lenses 7b, and the projected and recessed fitting structure 7c, of the optical element structure 7, a parallel flat plate 7e is also integrated by bonding. The aspect of the invention shown in FIGS. 5(A) through 5(D) can be applied to a case in which the package 3, for example, is provided as a common structure to which a plurality of kinds of optical element structures 7 are respectively combined to provide semiconductor photodetector elements with characteristics differing from one another.

While the above aspects were explained as applied to semiconductor photodetector devices, the invention is not limited to semiconductor photodetector devices, but can be applied to semiconductor devices in which a semiconductor chip must be aligned on a package.

In addition, in the above aspects, the package 3 and the case 7a or the lenses 7b of the optical element structure 7 are formed by molding resin. However, the material is not limited to resin, and ceramic, glass, metal, etc. can be used with a process for forming that is not limited to molding.

According to the aspects of the present invention described above, guide projections and spring projections are formed around a package or a die pad on a package onto which a semiconductor chip is die bonded. The spring projections cause the semiconductor chip to abut the guide projections. Therefore, during die bonding, the mounting position of the semiconductor chip can be determined to allow alignment to be easily, accurately, and surely carried out.

When combining an optical element structure with the package, a recessed and projected fitting structure formed at a jointed section of the package and the optical element structure may be used to easily perform optical alignment.

The position of the semiconductor chip can be easily and accurately aligned on the package for die bonding by fitting the semiconductor chip between the guide projections and the spring projections. The position can be accurately maintained through curing processing of an adhesive until the semiconductor chip 1 is completely fixed onto the package.

Further, because the position of the semiconductor chip may be accurately determined on the package, and the package and the optical element structure may be combined and bonded using the recessed and projected fitting structure, the semiconductor chip and the optical element structure may be integrally formed easily and accurately.

Thus, according to the aspects of the present invention described above, a semiconductor device can be provided in which accuracy of the mounting position of the semiconductor chip onto the package is improved without being affected by operation of a mounting device such as a die bonder.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A semiconductor device having a semiconductor chip die bonded on a die pad section of a package, comprising:
   guide projections around a perimeter of the die pad section of the package;
   spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment; and
   a recess, with a bottom that is lower than the die pad section, that is adjacent to the guide projections or the spring projections.

2. The semiconductor device as claimed in claim 1, wherein the guide projections and the spring projections are provided in pairs and a pushing direction of one of the spring projections toward the associated guide projection in a pair crosses another pushing direction in another pair.

3. The semiconductor device as claimed in claim 1, wherein the guide projections and the spring projections are provided in pairs in which each pushing direction of the spring projections toward the associated guide projections is in the same direction.

4. The semiconductor device as claimed in claim 1, wherein each of the spring projections and the guide projections has a guiding sloped portion on a side facing the die pad section to guide the semiconductor chip.

5. The semiconductor device as claimed in claim 2, wherein each of the spring projections and the guide projections has a guiding sloped portion on a side facing the die pad section to guide the semiconductor chip.

6. The semiconductor device as claimed in claim 3, wherein each of the spring projections and the guide projections has a guiding sloped portion on a side facing the die pad section to guide the semiconductor chip.

7. A semiconductor device having a semiconductor chip die bonded on a die pad section of a package, comprising:
   guide projections around a perimeter of the die pad section of the package; and
   spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment,
   wherein the package has a recess with a bottom that is lower than the die pad section between the spring projections and the guide projections at least at a front of the guide projections.

8. A semiconductor device having a semiconductor chip die bonded on a die pad section of a package, comprising:
   guide projections around a perimeter of the die pad section of the package; and
   spring projections around the perimeter of the die pad section of the package, each spring projection being opposite an associated-guide projection, the semiconductor chip being pushed against the guide projections by the spring projections to align the semiconductor chip for die bonding on the die pad section, each of the guide projections being used as a reference for alignment,
   wherein the package has a recess with a bottom that is lower than the die pad section, the recess surrounding a bottom of the spring projections.

9. A semiconductor device having a semiconductor chip die bonded on a die pad section of a package, comprising:
   guide projections around a perimeter of the die pad section of the package;
   spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment;
   an optical element structure mounted on the package and having an optical system that positions a focal point at the semiconductor chip; and a recessed and projected lifting structure to align the optical element structure onto the package, the recessed and projected structure having a fitting recess in the package and a fitting projection in the optical element structure that are fitted to each other.

10. The semiconductor device as claimed in claim 9, wherein in a direction in which strict alignment of the optical element structure is required, enlarging an adjustment clearance area in the recessed and projected fitting structure, and in a direction in which no alignment of the optical element structure is required, reducing the adjustment clearance area.

11. The semiconductor device as claimed in claim 9, wherein the package and the optical element structure are fixed to each other by an adhesive.

12. The semiconductor device as claimed in claim 10, wherein the package and the optical element structure are fixed to each other by an adhesive.

13. A semiconductor device having a semiconductor chip die bonded on a die pad section of a package, comprising:

guide projections around a perimeter of the die pad section of the package; and spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment, wherein the guide projections and the spring projections are provided in pairs and a pushing direction of one of the spring projections toward the associated guide projection in a pair crosses another pushing direction in another pair, and wherein the package has a recess with a bottom that is lower than the die pad section between the spring projections and the guide projections at least at a front of the guide projections.

14. A semiconductor device having a semiconductor chip die bonded on a die pad section of a package, comprising:

guide projections around a perimeter of the die pad section of the package; and spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment, wherein the guide projections and the spring projections are provided in pairs and a pushing direction of one of the spring projections toward the associated guide projection in a pair crosses another pushing direction in another pair, and wherein the package has a recess with a bottom that is lower than the die pad section, the recess surrounding a bottom of the spring projections.

15. A semiconductor device having a semiconductor chip die bonded on a die pad section of a package comprising:

guide projections around a perimeter of the die pad section of the package;

spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment;

an optical element structure mounted on the package and having an optical system that positions a focal point at the semiconductor chip; and a recessed and projected fitting structure to align the optical element structure onto the package, the recessed and projected structure having a fitting recess in the package and a fitting projection in the optical element structure that are fitted to each other, wherein the guide projections and the spring projections are provided in pairs and a pushing direction of one of the spring projections toward the associated guide projection in a pair crosses another pushing direction in another pair.

16. A semiconductor device having a semiconductor chip die bonded on a die pad section of a package, comprising:

guide projections around a perimeter of the die pad section of the package; and spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment, wherein the guide projections and the spring projections are provided in pairs in which each pushing direction of the spring projections toward the associated guide projections is in the same direction, and wherein the package has a recess with a bottom that is lower than the die pad section between the spring projections and the guide projections at least at a front of the guide projections.

17. A semiconductor device having a semiconductor chip die bonded on a die pad section of a package, comprising:

guide projections around a perimeter of the die pad section of the package; and spring projections around the perimeter of the die pad section of the package, each spring projection being opposite an associated guide projection, the semiconductor chip being pushed against the guide projections by the spring projections to align the semiconductor chip for die bonding on the die pad section, each of the guide projections being used as a reference for alignment, wherein the guide projections and the spring projections are provided in pairs in which each pushing direction of the spring projections toward the associated guide projections is in the same direction, and wherein the package has a recess with a bottom that is lower than the die pad section, the recess surrounding a bottom of the spring projections.

18. A semiconductor device having a semiconductor chip die bonded on a die pad section of a package, comprising:

guide projections around a perimeter of the die pad section of the package;

spring projections around the perimeter of the die pad section of the package, each spring projection being opposite an associated guide projection, the semiconductor chip being pushed against the guide projections by the spring projections to align the semiconductor chip for die bonding an the die pad section, each of the guide projections being used as a reference for alignment;

an optical element structure mounted on the package and having an optical system that positions a focal point at the semiconductor chip; and a recessed and projected filling structure to align the optical element structure onto the package, the recessed and projected structure having a fitting recess in the package and a fitting projection in the optical element structure that are fitted to each other, wherein the guide projections and the spring projections are provided in pairs in which each pushing direction of the spring projections toward the associated guide projections is in the same direction.

19. A method of aligning a semiconductor chip on a die pad of a semiconductor device, comprising:

forming guide projections around a perimeter of the die pad;

forming spring projections around the perimeter of the die pad, each spring projection being paired with an associated guide projection;

forming a recess, with a bottom that is lower than the die pad, adjacent to the guide projections or the spring projections;

placing the semiconductor chip on the die pad between the guide projections and the spring projections, the spring projections bending to receive the semiconductor chip and pushing the semiconductor chip against the guide projections to align the semiconductor chip; and die bonding the aligned semiconductor chip to the die pad.

* * * * *

UNITED STATES PATENT AND TRADEMARK OFFICE
CERTIFICATE OF CORRECTION

PATENT NO. : 6,812,579 B2
DATED : November 2, 2004
INVENTOR(S) : Toshio Yamamoto et al.

It is certified that error appears in the above-identified patent and that said Letters Patent is hereby corrected as shown below:

Column 14,
Line 45, change "associated-guide" to -- associated guide --

Column 15,
Line 1, change "lifting" to -- fitting --.

Column 17,
Line 8, change "filling" to -- fitting --.

Signed and Sealed this

Tenth Day of May, 2005

JON W. DUDAS
*Director of the United States Patent and Trademark Office*